(12) United States Patent
Long et al.

(10) Patent No.: US 10,431,434 B2
(45) Date of Patent: *Oct. 1, 2019

(54) POWERED GRID FOR PLASMA CHAMBER

(71) Applicant: Lam Research Corporation, Fremont, CA (US)

(72) Inventors: Maolin Long, Santa Clara, CA (US); Alex Paterson, San Jose, CA (US); Richard Marsh, San Ramon, CA (US); Ying Wu, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/947,629

(22) Filed: Apr. 6, 2018

(65) Prior Publication Data
US 2018/0226233 A1    Aug. 9, 2018

Related U.S. Application Data

(63) Continuation of application No. 13/161,372, filed on Jun. 15, 2011, now Pat. No. 9,966,236.

(51) Int. Cl.
*H01J 37/32* (2006.01)
*H01L 21/683* (2006.01)

(52) U.S. Cl.
CPC ...... *H01J 37/32651* (2013.01); *H01J 37/321* (2013.01); *H01J 37/32697* (2013.01); *H01L 21/6831* (2013.01)

(58) Field of Classification Search
CPC .... H01J 37/32; H01J 37/321; H01J 37/32651; H01J 37/32697; H01L 21/6831; H01L 21/683
See application file for complete search history.

(56) References Cited

U.S. PATENT DOCUMENTS

| | | | | |
|---|---|---|---|---|
| 5,433,812 A | * | 7/1995 | Cuomo | H01J 37/321 118/723 I |
| 5,540,800 A | * | 7/1996 | Qian | C23C 16/507 118/723 I |
| 5,685,941 A | * | 11/1997 | Forster | H01J 37/32091 118/723 E |
| 6,422,173 B1 | * | 7/2002 | Nakajima | H01J 37/321 118/723 AN |
| 7,223,321 B1 | * | 5/2007 | Comendant | H01J 37/321 118/723 AN |
| 9,767,996 B2 | * | 9/2017 | O'Neill | H01J 37/32651 |
| 2007/0004208 A1 | * | 1/2007 | Ohkuni | C23F 4/00 438/689 |

* cited by examiner

*Primary Examiner* — Thai Pham

(74) *Attorney, Agent, or Firm* — Penilla IP, APC

(57) ABSTRACT

A plasma processing chamber and methods for operating the chamber are provided. An exemplary chamber includes an electrostatic chuck for receiving a substrate and a dielectric window connected to a top portion of the chamber. An inner side of dielectric window faces a plasma processing region that is above the electrostatic chuck and an outer side of the dielectric window is exterior to the plasma processing region. Inner and outer coils are disposed above the outer side of the dielectric window, and the inner and outer coils are connected to a first RF power source. A powered grid is disposed between the outer side of dielectric window and the inner and outer coils. The powered grid is connected to a second RF power source that is independent from the first RF power source.

26 Claims, 10 Drawing Sheets

POWERED GRID FOR PLASMA CHAMBER

CLAIM OF PRIORITY

The present patent application is a continuation of and claims the benefit of and priority, under 35 U.S.C. § 120, to U.S. patent application Ser. No. 13/161,372, filed on Jun. 15, 2011, and titled "Powered Grid for Plasma Chamber", which is incorporated by reference herein in its entirety for all purposes.

FIELD

The present patent application relates generally to semiconductor fabrication, and more particularly, to an apparatus containing a powered grid for maintaining the condition of a window of an inductively coupled plasma etching apparatus.

DESCRIPTION OF RELATED ART

In semiconductor manufacturing, etching processes are commonly and repeatedly carried out. As is well known to those skilled in the art, there are two types of etching processes: wet etching and dry etching. One type of dry etching is plasma etching performed using an inductively coupled plasma etching apparatus.

A plasma contains various types of radicals, electrons, as well as positive and negative ions. The chemical reactions of the various radicals, positive ions, and negative ions are used to etch features, surfaces and materials of a wafer. During the etching process, a chamber coil performs a function analogous to that of a primary coil in a transformer, while the plasma performs a function analogous to that of a secondary coil in the transformer.

The reaction products generated by the etching process may be volatile or non-volatile. The volatile reaction products are discarded along with used reactant gas through the gas exhaust port. The non-volatile reaction products, however, typically remain in the etching chamber in significant amounts. The non-volatile reaction products may adhere to the chamber walls and a dielectric window. Adherence of non-volatile reaction products to the window may interfere with the etching process. Excessive deposition may result in particles flaking off the window onto the wafer, thus interfering with the etching process. Excessive deposition, therefore, requires more frequent cleaning of the chamber walls and the window which adversely affects wafer throughput. Additionally, if the window becomes coated with etch byproducts that are electrically conductive, the ability of the chamber transmit sufficient magnetic flux to the plasma becomes diminished, which in turn reduces the ability to control the directionality of etch operations, which are critical when processing high aspect ratio profile features.

In view of the foregoing, there is a need for an apparatus and methods for protecting a process chamber's dielectric window, while maintaining the ability to transmit sufficient levels magnetic flux to the plasma.

SUMMARY

Disclosed is an apparatus used in etching semiconductor substrates and layers formed thereon during the manufacture of semiconductor devices. The apparatus is defined by a chamber in which etching is performed. The apparatus includes a chuck for supporting a substrate to be etched, connections to RF power and ground, a dielectric window located in an upper roof section of the chamber, and a radio frequency (RF) coil disposed over the dielectric window.

Further disposed within the chamber is a powered grid. The powered grid is a structure that is disposed externally to the chamber and is connected to RF power that is independent of the power provided to the coil. In one embodiment, the powered grid is a metallic layer formed over a substrate. The substrate is disposed over the window and the RF coils are disposed over the powered grid.

A plasma processing chamber is provided. The chamber includes an electrostatic chuck for receiving a substrate and a dielectric window connected to a top portion of the chamber. An inner side of dielectric window faces a plasma processing region that is above the electrostatic chuck and an outer side of the dielectric window is exterior to the plasma processing region. Inner and outer coils are disposed above the outer side of the dielectric window, and the inner and outer coils are connected to a first RF power source. A powered grid is disposed between the outer side of dielectric window and the inner and outer coils. The powered grid is connected to a second RF power source that is independent from the first RF power source.

In another embodiment, a chamber for use in plasma processing, is provided. The chamber includes a housing and a chuck for supporting a wafer in the housing. A top section of the housing is defined by a dielectric window, and a powered grid is disposed over the dielectric window. TCP coils are disposed over the powered grid. RF power is connected to the powered grid independently from the TCP coils.

In another embodiment, a method for processing a wafer in a plasma etching chamber is disclosed. The method includes applying a first RF power over a top dielectric window of the plasma etching chamber, wherein the first RF power is applied to inner and outer coils. And, applying a second RF power over the top dielectric window of the plasma etching chamber, wherein the second RF power is applied to a powered grid that is disposed between the inner and outer coils and the dielectric window. The method includes setting the first RF power independently from the setting of the second RF power. The a frequency and power level applied by the second RF power is different than a frequency and power level applied by the first RF power.

In one embodiment, the frequency of the second RF power is set to a low frequency that ranges between 1.5 MHz and 2.5 MHz and is tuned to a load seen by the powered grid from a plasma processed in the plasma etching chamber.

In one embodiment, the power level of the second RF power in Watts is adjustable independently from the power level of the first RF power in Watts.

Without a powered grid optimized as defined herein, deposits that result from the etching materials and etch chemistries would more readily adhere to the inner surface of the dielectric window, which eventually impacts the capability of the RF coils to impart sufficient energy and control to a plasma that is generated within the chamber. Such impacts can include reductions in ion density in the plasma, reductions in radial control of ion density, and other process reducing drawbacks. For example, etching of refractory metals leads to so much deposits on the dielectric window of the chamber, and these electrically conductive deposits (as they build up) increasingly prevent the coupling of magnetic fields from the excitation coil to the plasma. This leads to a reduction in plasma density, process drift, and eventually an inability to ignite an inductive plasma. Furthermore, although some reductions in process performance would be acceptable in past chamber configurations, the drive to shrink feature sizes has continued to demand even tighter tolerances in process performance Commensurate with feature size shrinking is the resulting demands to etch very high aspect ratio features.

Thus, as feature sizes continue to decrease to the low nanometer process nodes and beyond, it is no longer acceptable to experience drifts in etch equipment performance over time. Further impacting this issue is the complementary fabrication demands for high throughput, and less time to perform equipment clean operations.

BRIEF DESCRIPTION OF THE DRAWINGS

Various embodiments, described herein, together with further advantages thereof, may best be understood by reference to the following description taken in conjunction with the accompanying drawings.

DETAILED DESCRIPTION

Disclosed is an apparatus used in etching semiconductor substrates and layers formed thereon during the manufacture of semiconductor devices. The apparatus is defined by a chamber in which etching is performed. A TCP coil is disposed over a dielectric window of the chamber, and a powered grid is disposed between dielectric window and the TCP coil. The powered grid is powered separately and independently of the power provided to the TCP coil. In the following description, numerous specific details are set forth in order to provide a thorough understanding of several embodiments described in the present disclosure. However, it will be apparent to one skilled in the art that various embodiments, described herein, may be practiced without some of these specific details. In other instances, well known process operations and implementation details have not been described in detail in order to avoid unnecessarily obscuring several embodiments, described herein.

Due to the increasing demand for nonvolatile random access memory with long-term data retention, high-speed on/off applications, faster write speed, and unlimited read-write endurance, MRAM (Magnetoresistive Random Access Memory) is becoming a promising candidate to replace various combinations of SRAM (static random access memory), DRAM (dynamic random access memory), flash memory components, and battery to provide fast, low-power, nonvolatile storage with significant boot time reduction for large systems. While MRAM is nonvolatile memory, the by-products in plasma etching for MRAM are usually nonvolatile—literally, and conductive. When the etch by-products in MRAM processing get deposited to the dielectric window in a conductor etch chamber, the TCP RF power efficiency may be reduced by the shielding effect of the conductive film that is gradually formed on the window by the by-products. The reduction of TCP power efficiency leads to plasma density drop and in some cases may cause process drifting from wafer to wafer. Therefore, the mean time between chamber cleaning (MTBC) is very short. By way of example, in some etch chambers processing MRAM, the MTBC is about 5 RF hours when bias RF power drops about 15% in voltage mode.

Figure 1A:
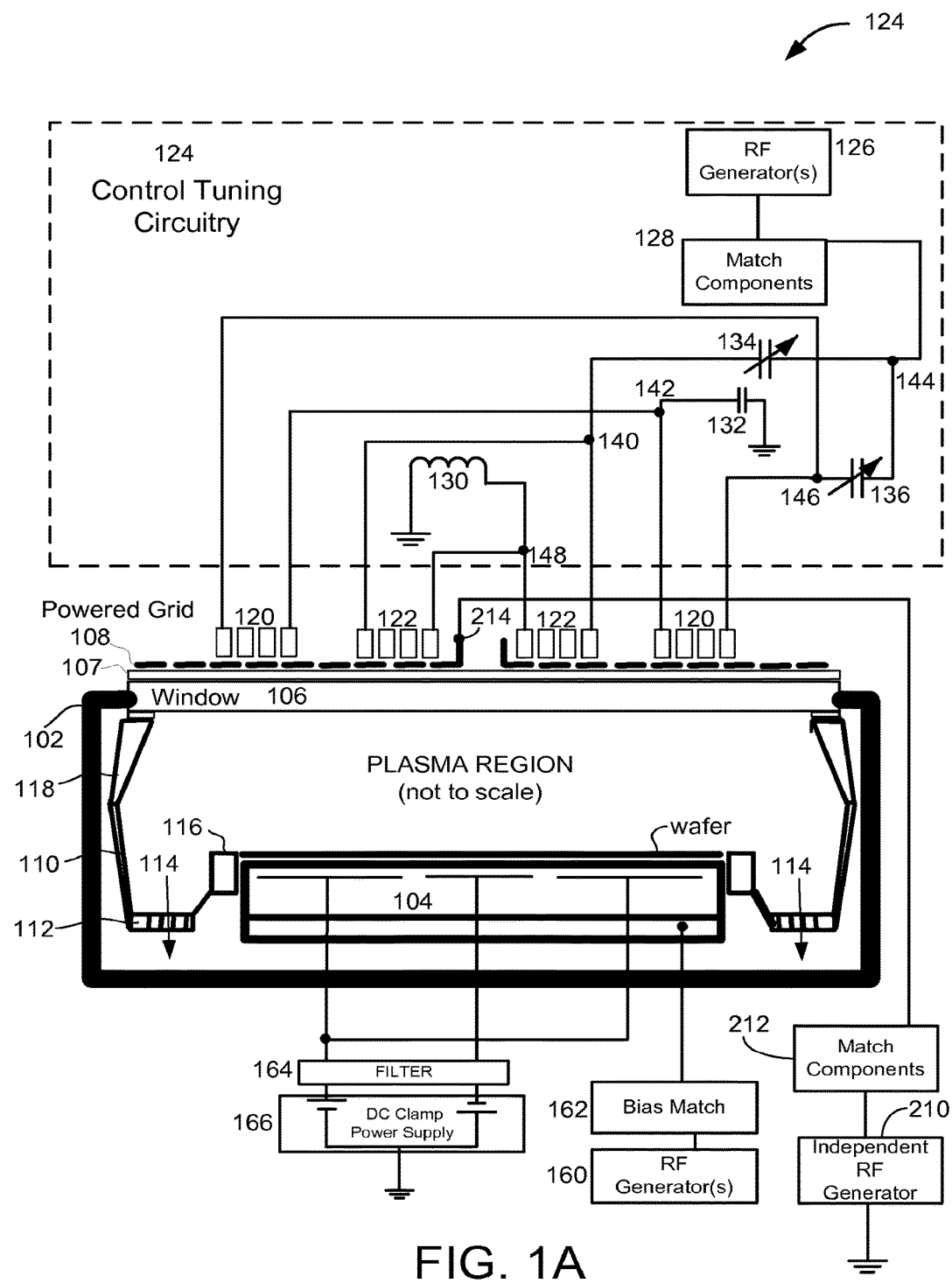
FIG. 1A illustrates a plasma processing system utilized for etching operations, in accordance with one embodiment described in the present disclosure.

By implementing the powered grid 108 in a plasma etch chamber, the effect of the deposits on the dielectric window will no longer be the factor in determining the MTBC. The powered grid 108, when disposed over the dielectric window 106 (externally), is independently powered from the power provided by the TCP coils 120/122, as shown in FIG. 1A below. The independent power is applied at a low frequency and is tuned to the plasma, which enables the powered grid 108 to reduce or eliminate adhesion of the nonvolatile metallic byproducts to the inside of the dielectric window.

As used herein, the term "independently" shall be construed to define cases where the RF power applied to the TCP coils has its own power level in Watts and frequency, and the RF power applied to the powered grid 108 has its own power level in Watts and frequency. Thus, the setting the first RF power (applied to the TCP coils) is independent from the setting of the second RF power (applied to the powered grid). In one embodiment, the frequency and power level applied by the second RF power is different than a frequency and power applied by the first RF power.

As such, less frequent cleaning of the dielectric window 106 is required, and it is possible to achieve longer MTBCs, which increase consistencies in the etch operations and throughput. Furthermore, the powered grid 108, when active, acts to perform in-situ cleaning and/or ex-situ cleaning of the window 106 (facing the plasma), so that the process performance is substantially identical from wafer to wafer.

In one embodiment, the powered grid 108 is placed on top of the dielectric window of a chamber. In one example, the chamber is a conductor plasma etch chamber, such as the Kiyo45™, manufactured by Lam Research Corporation, of Fremont Calif. It should be understood, however, that the powered grid 108 can be added to plasma chambers made by any manufacturer, to provide independent RF power above a dielectric window. As shown in FIG. 1A, the powered grid 108 is defined on a substrate 107. The powered grid 108 and substrate 107 are placed under the TCP coils. Although this configuration is shown to be flat, other types of top power configurations, such as dome configurations, can implement a powered grid 108 (suitably shaped), to provide the increased performance.

In one embodiment, the powered grid 108 is powered by a 2 MHz through a matching network and a RF generator. The RF power to the powered grid 108 is adjusted to a level, for a broad process window, so that the ions bombarding the dielectric window have the right energy that can keep the window clean in-situ during processing and/or that can sputter off the deposited etch by-product on the dielectric window ex-situ during the cleaning step. In this manner, the dielectric window is cleaned to about the same extent for every wafer to eliminate the process drift from wafer to wafer. The in-situ and ex-situ cleaning by physical sputtering can also be combined with soft-landing step(s) and certain/proper chemistry to speed up the cleaning results and at the same time to protect the dielectric window from sputtering and particles from being generated.

A chamber optimized for plasma etching, utilizing the powered grid 108 can be used to etch any number of materials. Without limitation, some example materials include, Pt, Ir, PtMn, PdCo, Co, CoFeB, CoFe, NiFe, W, Ag, Cu, Mo, TaSn, Ge2Sb2Te2, InSbTe Ag—Ge—S, Cu—Te—S, IrMn, Ru. The concept can be extended to materials like NiOx, SrTiOx, Perovskite (CaTiO3), PrCAMnO3, PZT (PbZr1-xTixO3), (SrBiTa) O3.

FIG. 1A illustrates a plasma processing system utilized for etching operations, in accordance with one embodiment described in the present disclosure. The system includes a chamber 102 that includes a chuck 104, a dielectric window 106, and a powered grid 108. The chuck 104 can be an electrostatic chuck for supporting the substrate when present. Also shown is an edge ring 116 that surrounds chuck 104, and has an upper surface that is approximately planar with a top surface of a wafer, when present over chuck 104. Chamber 102 also includes a lower liner 110, that is coupled to an upper liner 118. The upper liner 118 is also sometimes referred to as the pinnacle of the chamber. The upper liner 118 is configured to support the dielectric window 106 and the powered grid 108. In one embodiment, the upper liner 118 is coupled to ground.

As shown, the powered grid 108 has a grid pattern, whereby the powered grid is defined from a metallic material formed over a substrate 107. The substrate 107 is a dielectric, and the grid pattern defined over the substrate can take on any number of geometric configurations. Without limitation, as will be illustrated in the following figures, the powered grid 108 is defined in the form of spokes that extend between a center region to the outer diameters of the window 106. The window and powered grid 108 therefore extend over a region where plasma is formed during processing, and is disposed over the chuck 104 that is designed to support a wafer during processing. The open spaces between the spokes are areas where no metallization of the powered grid is present. Instead of spokes, any metallic geometric pattern can be provided, with open spaces therebetween.

Further shown is an RF generator 160, which can be defined from one or more generators. If multiple generators are provided, different frequencies can be used to achieve various tuning characteristics. A bias match 162 is coupled between the RF generators 160 and a conductive plate of the assembly that defines the chuck 104 (also referred to as the bottom electrode). The chuck 104 also includes electrostatic electrodes to enable the chucking and dechucking of the wafer. Broadly, a filter 164 and a DC clamp power supply is provided. Other control systems for cooling, and for lifting the wafer off of the chuck 104 can also be provided, but not shown. Although not shown, pumps are connected to the chamber 102 to enable vacuum control and removal of gaseous byproducts from the chamber during operational plasma processing.

The powered grid 108 has a central region that will allow a showerhead to deliver process gases into the processing volume of the chamber 102. Additionally, other probing apparatus can also be disposed through the powered grid 108 near the central region, where the hole is provided. The probing apparatus can be provided to probe process parameters associated with the plasma processing system, during operation. Probing processes can include endpoint detection, plasma density measurements, and other metric probing operations. The circular shape of the powered grid 108 is defined due to the geometry of a typical wafer, which is usually circular. As is well known, wafers typically are provided in various sizes, such as 200 mm, 300 mm, 450 mm, etc. Additionally, other shapes are possible for square type substrates or smaller substrates, depending on the etching operations performed within chamber 102.

The dielectric window 106 can be defined from a ceramic or quartz type material. The window 106 has an inner side that faces the process region of the plasma and an outer side that is exterior to the chamber. Other dielectric materials are also possible, so long as they are capable of withstanding the conditions of a semiconductor etching chamber. Typically, chambers operate at elevated temperatures ranging between about 50 Celsius and about 120 Celsius, or greater. The temperature will depend on the etching process operation and specific recipe. The chamber 102 will also operate at vacuum conditions in the range of between about 1 m Torr (mT) and about 100 m Torr (mT). Although not shown, chamber 102 is typically coupled to facilities when installed in a clean room, or a fabrication facility. Facilities include plumbing that provide processing gases, vacuum, temperature control, and environmental particle control.

These facilities are coupled to chamber 102, when installed in the target fabrication facility. Additionally, chamber 102 may be coupled to a transfer chamber, that will enable robotics to transfer semiconductor wafers into and out of chamber 102 using typical automation.

Continuing with reference to FIG. 1A, the TCP coil is shown to include an inner coil (IC) 122, and an outer coil (OC) 120. The TCP coil is placed and arranged over the powered grid 108, which is respectively placed over the dielectric window 106. The TCP coil inner structure and outer structure is defined relative to the radial locations over the window 106, and the TCP power is tunable using control tuning circuitry unit 124.

In one embodiment, the TCP coil is coupled to the control tuning circuitry 124 which includes connections to the inner coil 120, and outer coil 122. As shown, the outer coil 120 outer loop is coupled to node 146, which in turn connects to variable capacitor 136. Variable capacitor 136 is disposed between node 146 and 144, before connecting to match components 128 and RF generators 126. The inner loop of the outer coil 120 is connected to node 142, which connects to capacitor 132. Capacitor 132 is coupled between ground and node 142. The inner coil 122 has its outer loops connected to node 140, which then connects to variable capacitor 134.

Variable capacitor 134 is coupled between node 140 and node 144. The inner loop of inner loop of inner coil 122 is coupled to node 148. Node 148 couples to inductor 130 that is also coupled to ground. Control tuning circuitry 124 therefore enables dynamic tuning of variable capacitors 134 and 136 to tune the power provided to the inner and outer coils that are placed over the powered grid 108.

In one embodiment, the control tuning circuitry 124 is configured to tune the TCP coil to provide more power to the inner coil 122 versus the outer coil 120. In another embodiment, the control tuning circuitry 124 is configured to tune the TCP coil to provide less power to the inner coil 122 versus the outer coil 120. In another embodiment, the power provided to the inner coil and the outer coil will be to provide an even distribution of power and/or control the ion density in a radial distribution over the substrate (i.e., wafer, when present). In yet another embodiment, the tuning of power between the outer coil and the inner coil will be adjusted based on the processing parameters defined for that etching being performed on the semiconductor wafer disposed over chuck 104.

In one implementation, a circuit having two variable capacitors are configured to be adjusted automatically to achieve a predetermined ratio of currents in the two coils. The ratio, in this implementation can be 0.1 to 1.5. In another implementation, the currents are about equal. In still another embodiment, the ratio is zero, such that only the outer coil is set in operation.

In one embodiment, the capacitors 134 and 136 are controlled by processing controllers, connected to the electronics panel of chamber 102. The electronics panel can be coupled to networking systems, that will operate specific processing routines that depend on the processing operations desired during specific cycles. The electronics panel can therefore control the etching operations performed in chamber 102, as well as control the specific settings of capacitors 134 and 136.

In this embodiment, the powered grid 108 is connected to its own independent RF power. The RF power can be obtained from a separate generator or can be obtained from another generator already used in the chamber, e.g., by splitting off a separately tunable RF line. The separately tunable RF line can be provided for a specific frequency that is suitable for operation of the powered grid 108. In general, however, it should be understood that the RF power provided to the powered grid 108 is separate and/or independent from and in addition to the TCP power provided by the RF coils 120/122. In one embodiment, FIG. 1A shows an independent RF generator 210 coupled to match components 212, connected to node 214. Node 214 is a connection to the powered grid 108. It can now be understood that the power provided to the powered grid 108 is independent of the power provided by the TCP coils. In one embodiment, the power provided to the inner and outer coils is provided by a first RF power source, while the power provided to the powered grid 108 is provided by a second RF power source, which is independent of the first RF power source.

As used herein, the chamber is a process chamber defined by a housing. The housing generally defines the structure for the chamber. The housing can be made from a metallic material, such as aluminum or stainless steel, or other known materials. Inside the housing is a chuck 104 and the top of the housing is defined by the dielectric window. The dielectric window can be of any known shape, such as flat or domed shape. The TCP coils can also take on any number of shapes to match the flat or dome shape, as well as the powered grid 108.

Figure 1B:
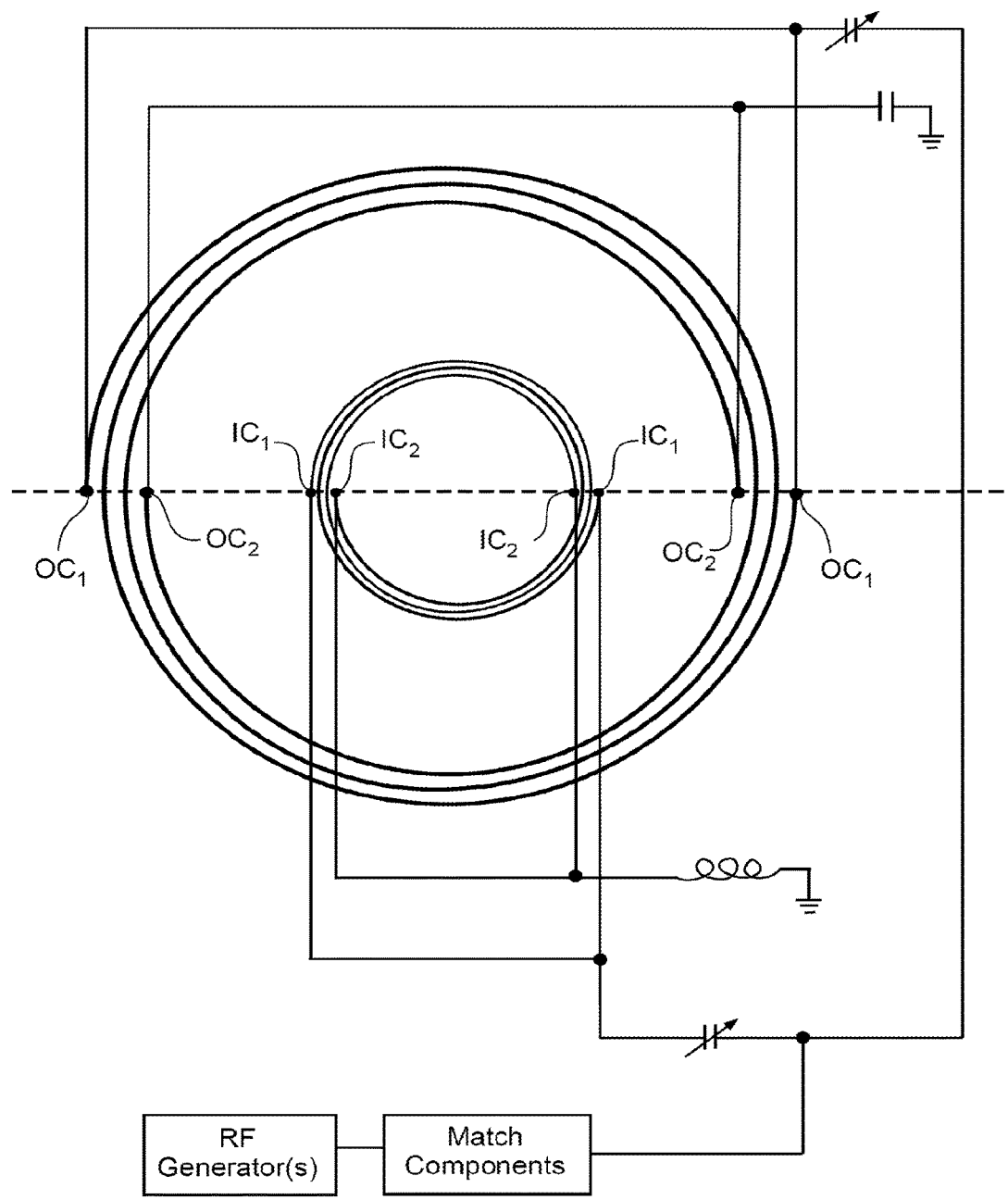
FIG. 1B illustrates a top view, schematically representing the inner coil and outer coil, in accordance with one embodiment described in the present disclosure.

FIG. 1B illustrates a top view, schematically representing the inner coil 122 and outer coil 120, in accordance with one embodiment described in the present disclosure. The cross-section shown in FIG. 1B represents the connections to the coil in FIG. 1A, as one example. The inner coil 122 will include an inner coil 1, and inner coil 2, an outer coil 1 and an outer coil 2. The connections between the coil ends are illustrated relative to the circuitry provided in the control to circuitry 124, as shown in FIG. 1A. The illustration in FIG. 1B was provided to show the circular winding associated with each of the inner and outer coils of the TCP coil utilized in chamber 102, in accordance with one embodiment described in the present disclosure. It should be appreciated that other types of coil configurations are possible. It is possible to have a dimensional coil that provides a dome type structure, and other coil type structures other than flat coil distributions. The powered grid 108 can thus be interposed between the coils and the window, no matter the chosen shape.

Figure 2:
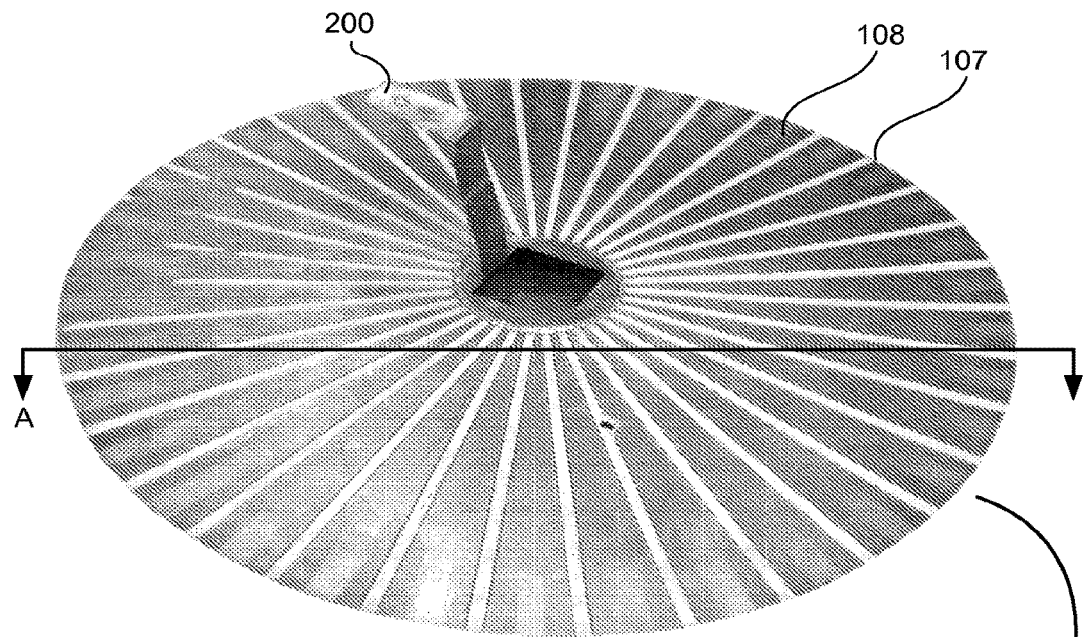
FIG. 2 illustrates an example of the powered grid, in accordance with one embodiment described in the present disclosure.

FIG. 2 illustrates a three-dimensional view of the powered grid 108, as formed over a substrate 107. In one embodiment, the substrate is a dielectric material. The dielectric material can be in the form of a rigid dielectric, or a rigid material typically used in printed circuit board (PCB) technologies. A PCB is capable of providing mechanical support for conductive materials deposited on its surface, and etched to define specific patterns. The specific pattern used in one embodiment is a spoke pattern connected to a center conductive region of the powered grid 108. The powered grid is therefore defined from a plurality of metallic features that are separated by open regions (i.e., regions that do not include metallic material). In one embodiment, the powered grid is a disk shape with a center opening, the center opening being metallic and being connected to a plurality of spokes or fins (e.g., geometric features) that are conductive.

In still another embodiment, the PCB is made from laminated dielectric materials to provide the necessary rigidity to support the metallic material patterned on a surface to define the spoke pattern. Alternatively, instead of a PCB material, a ceramic disc, or mix of ceramic and other dielectric materials, as well as dielectrics like Teflon™, can be used to support the metallic patterns used to define the powered grid 108. Still further, the powered grid 108 can be defined from any number of patterns instead of the spoke pattern shown in FIG. 2. Essentially, the patterns can take on any number of shapes so long as gaps or spaces are defined between the metallic material to enable the TCP power provided by the coils to be transferred to the plasma within the chamber.

Fundamentally, the powered grid is an electrode that is transparent to inductive coupling, but controls capacitive coupling. As such, the powered grid 108 acts as a capacitively coupled electrode that is independent of the TCP coils of the chamber. It should be understood that the powered grid 108, in some circumstances, may be referred to as a type of Faraday shield or powered Faraday shield. However, the powered grid 108 is not physically acting as a Faraday shield. Nevertheless, if those skilled in the art referred to the powered grid 108 as a type of powered Faraday shield, the functional and physical operation of the powered grid should take precedent. That is, the powered grid 108 is an electrode that is transparent to inductive coupling, but still controls capacitive coupling.

FIG. 2 also shows a strap 200 that connects to a central location of the powered grid 108. The central location enables distribution of the RF power to the entire surface of the powered grid 108 to the outer diameters that will cover substantially the surface of the dielectric window 106, when installed. The strap 200, as will be shown below, is provided with the independent RF power described above. In the illustrated example, the metallic material that defines the powered grid 108 is copper, patterned over the substrate 107.

It should be understood that other metallic materials can be used instead of copper, so long as sufficient RF conduction is enabled across the surface of the powered grid 108. The strap 200, in this embodiment, is also defined from copper to provide good electrical conduction between the RF power source and the powered grid 108.

Figure 3:
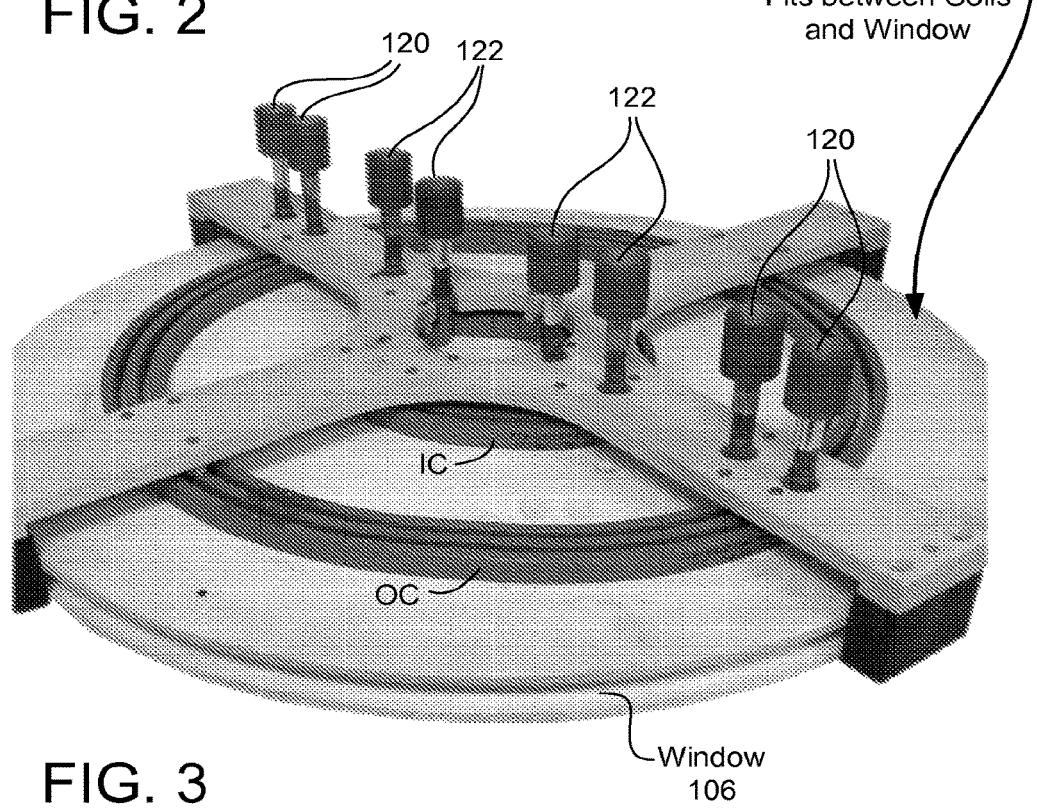
FIG. 3 illustrates an example of the dielectric window before including the powered grid, in accordance with one embodiment described in the present disclosure.

FIG. 3 illustrates a three-dimensional view of the dielectric window 106, before the powered grid 108 is installed between the dielectric window 106 and the TCP coils. As shown, the window 106 is a ceramic dielectric that is placed over a chamber, as shown in FIG. 1A. The TCP coils and associated loops are shown arranged over the dielectric window 106. The outer coils 120 and the inner coils 122 are shown with RF connections that feed to the inner coils and outer coils. A support structure for connecting the RF power to the coils is also illustrated.

Figure 4:
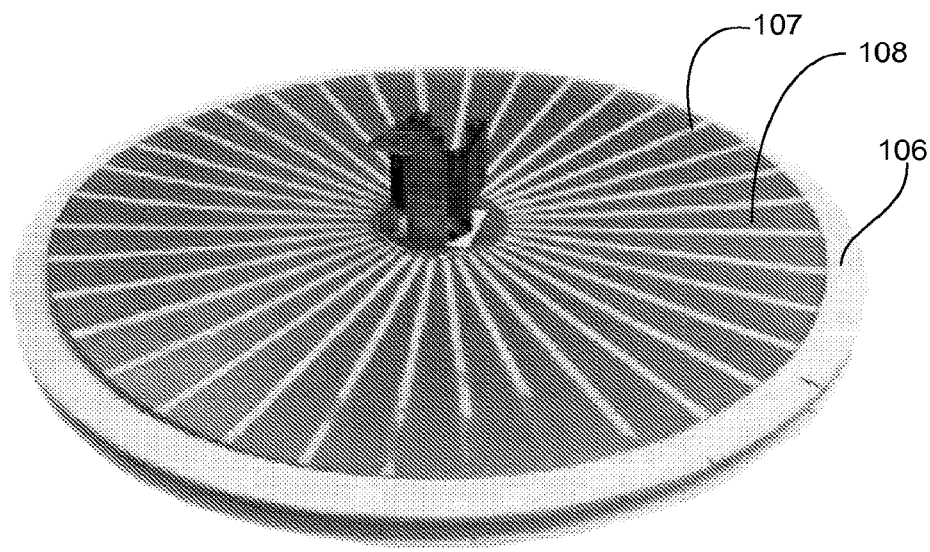
FIG. 4 illustrates the powered grid disposed over the dielectric window, in accordance with one embodiment described in the present disclosure.

FIG. 4 illustrates a three-dimensional view of the powered grid 108 disposed over the dielectric window 106. As shown, the powered grid 108, and it's substrate 107 are disposed in a substantial flat orientation over the dielectric window 106. The substrate 107 is in direct contact with the dielectric window 106. In another embodiment, a space may be provided between the substrate 107 and the powered grid 108. In still another embodiment, the powered grid 108 can be defined from a metallic material that does not require a substrate 107. The metallic material would have sufficient rigidity to be placed over the dielectric window 106 in a spaced apart orientation. Alternatively, if the powered grid 108 is formed from a metallic material without a substrate, the powered grid 108 can be directly placed over the dielectric window 106. Accordingly, it should be understood that the powered grid 108 can take on any number of physical configurations, so long as the powered grid 108 can be independently powered, and can be placed, connected, attached, or positioned over the dielectric window 106.

Figure 5:
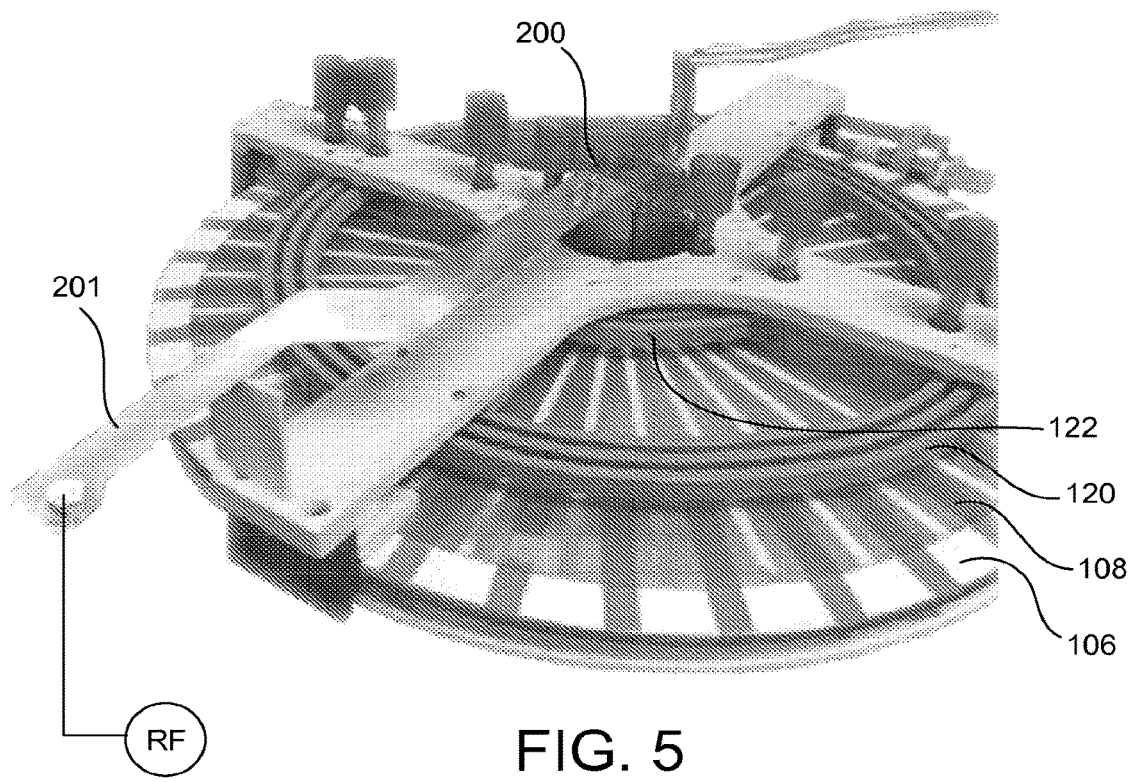
FIG. 5 illustrates the powered grid disposed between the dielectric window and the TCP coils, in accordance with one embodiment described in the present disclosure.

FIG. 5 illustrates a three-dimensional view of the powered grid 108 when disposed over the dielectric window 106 and placed below the TCP coils, in accordance with one embodiment described in the present disclosure. The illustrated picture of the powered grid 108 is a test bench used to prove the effectiveness of the powered grid 108. Accordingly, the powered grid 108 is shown temporarily attached to the dielectric window 106 using an adhesive tape. In a commercial implementation, the powered grid 108 would be connected to the system without the use of the adhesive tape used in the test bench. Nevertheless, FIG. 5 illustrates the relative positioning of the powered grid 108 relative to the dielectric window 106 and the TCP coils 122/120.

Also shown is an extension strap 201 that connects to strap 200 of the powered grid 108. The extension strap 201 is configured for coupling to the independent RF power, and shown as a connection to RF, for simplicity. As described above, the dielectric window 106 will sit over the chamber, and the exterior of the chamber will contain the powered grid 108, and the TCP coils. The bottom of the dielectric window 106, which is opposite the side containing the powered grid 108 will face the plasma in the chamber, when in operation. As such, powered grid 108 is exterior to the processing chamber, as are the TCP coils.

Figure 6:
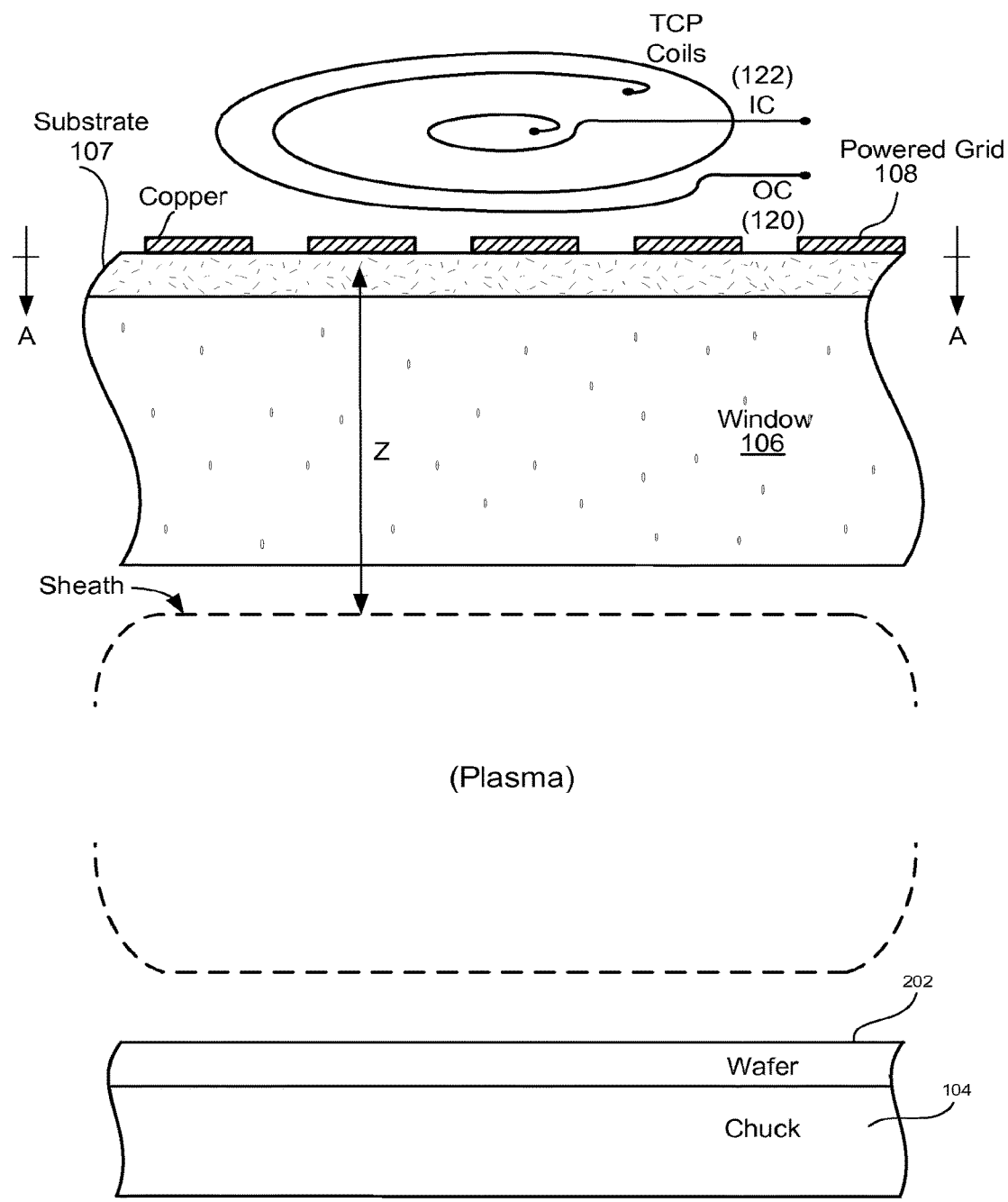
FIG. 6 illustrates an example cross-section of the dielectric window and the power grid defined below the TCP coils, in accordance with one embodiment described in the present disclosure.

FIG. 6 illustrates a cut out section of the dielectric window 106 and the powered grid 108, in accordance with one embodiment described in the present disclosure. As shown, the window 106 will have a thickness that is commonly between about 10 mm and about 50 mm, depending on the material in use. Disposed above the window is a substrate 107 that is between about 0.5 mm to about 3 mm, and more preferably between about 1 mm and about 2 mm, and nominally about 1.5 mm (e.g. about 60 mils). It should be noted that substrate 107 can be defined from various types of materials, such as the noted PCB type materials, Teflon, ceramics, etc.

FIG. 6 also shows the general placement of the TCP coils 120 and 122, relative to the powered grid 108 and window 106. When in operation, a plasma is generated inside the chamber, and a plasma sheath will be defined adjacent to the inside surface of window 106. Likewise, the wafer 202 placed over chuck 104 will experience a plasma sheath proximate to the surface of the wafer 202. The specific control of the plasma sheath and etching process will depend on the power provided by the TCP coils, the power provided to the bottom electrode (chuck 104), the pressure provided to the chamber, the temperature, the frequencies of the power provided to the chamber, the etching chemistries, and other settings specific to the recipe selected for operation.

In operation, there will be a sheath proximate to the window 106. In one embodiment, an approximate distance Z is defined between the plasma sheath and the powered grid 108. This distance is one of the variables that defines the plasma impedance seen by the powered grid 108. The powered grid 108 is independently connected to a separate RF generator that is matched and tuned to the specific plasma impedance seen from the standpoint of the powered grid 108.

In one embodiment, the thickness of the metallic material of the powered grid 108 is between about 0.075 mm and about 0.5 mm and preferably about 0.3 mm (e.g., about 5 mils). In this example, the metallic material is copper. However, other metallic materials, such as aluminum, brass, silver, plated copper, etc., can also be used.

Figure 7:
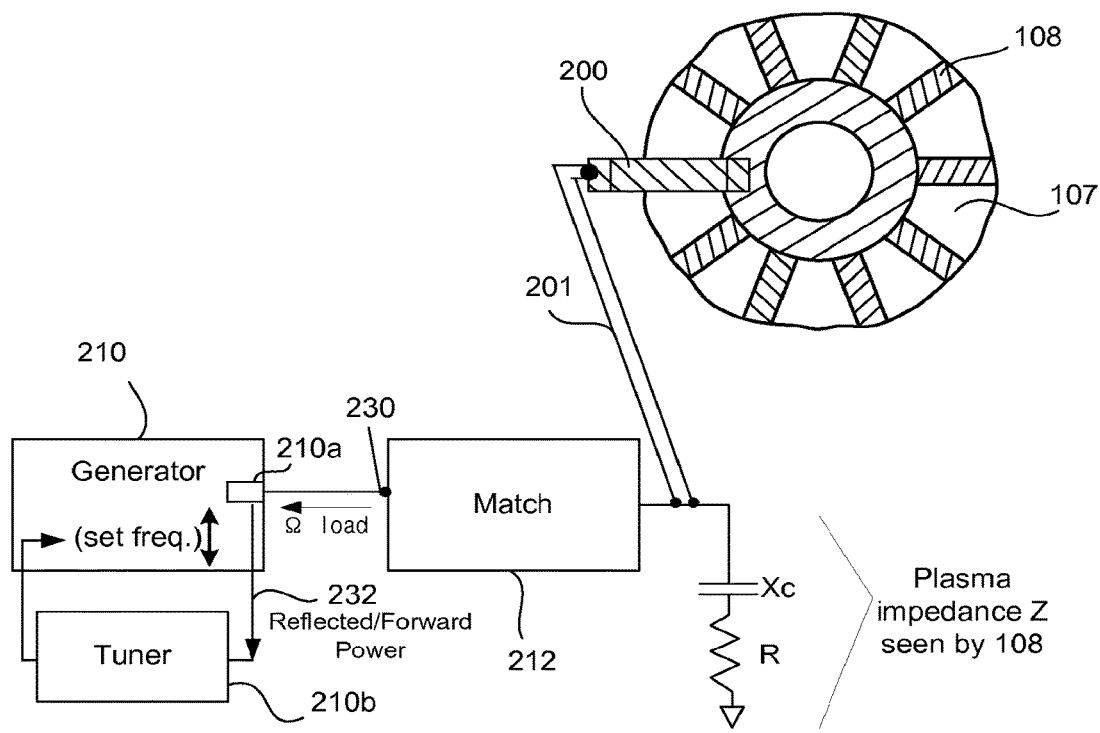
FIG. 7 illustrates an example of the independent RF power source connected to the powered grid, which is frequency tunable and can be set to different power settings for specific recipes (without impacting the control of the TCP power that is independent), in accordance with one embodiment described in the present disclosure.

FIG. 7 illustrates the connections between the RF generator 210 and the powered grid 108. The powered grid 108 is electrically connected by strap 200 and extension strap 201 to the generator 210. Match 212 is shown schematically connected to a load illustrated as impedance seen by the powered coil 108 is represented as Z that is R-jXc. Generator 210 includes a directional coupler 210a, which couples to a tuner 210b to set the frequency of generator 210, based on the load seen by the powered grid 108.

In one embodiment, the generator 210 has an internal 50 ohm impedance, and if the generator sees 50 ohms load at point 230 from the match 212, the match is set. If during operation, the match 212 presents a 10 ohm load at point 230, a match will no longer exist between the 50 ohm impedance of the generator 210 and the 10 ohm load at point 230. In such an example, the 10 ohm at point 230 represents high reflective power from the plasma, as seen from the powered grid 108. The directional coupler 210a will then sense the reflected/forward power 232 caused by the mismatch, which is provided to the tuner 210b. The example of 50 and 10 ohms is just an example.

Thus, in accordance with the example, the reflected/forward power 232 is used to tune the frequency setting of the generator 210. Then, the frequency of the generator 210 is dynamically set based on the tuning provided by reading the reflected/forward power 232 by the tuner 210b. By changing the frequency of the generator 210, which is tunable, the impedance of the generator 210 is matched to the load at point 230. In this embodiment, therefore, the powered grid is powered at a low frequency that is around about 2 MHz, and is adjusted based on the impedance seen by the generator 210 at the input side of the match. In one embodiment, the tuning sets the frequency of the generator 210, depending on the loads during processing, to between about 1.5 MHz and about 2.5 MHz, and more preferably, between about 1.9 MHz and about 2.1 MHz. In one embodiment, the setting of the frequency of the RF power source connected to the powered grid 108 is automatically adjusted based on the load seen by the match.

This automatic adjustment occurs over time during processing and based on conditions in the plasma etch chamber. The automatic adjustment can be upward, downward, or periodically up and down. For instance, one adjustment range around 2 MHz can be between about 0.01+/− MHz and about 1.0+/− MHz, and more preferably between about 0.05+/− MHz and about 0.5+/− MHz. This tuning is, in one embodiment possible because the RF power (frequency and power level in Watts) is completely independent of the setting of the RF power (frequency and power level in Watts) of the TCP coil. In one embodiment, the tuning for the powered grid 108 can be set using a commercially available generator with frequency tuning capabilities.

In one embodiment, the RF generator 210 is operated at a lower frequency of around 2 MHz so as to provide improved control using the higher energy tail, commonly referred to with reference to the bimodal ion energy distribution at low frequencies. For instance, with reference to ion energy distribution function (IEDF), it is known that lower frequencies provide higher energies with a bimodal distribution. This higher energy acts to provide additional energy to the plasma sheath that sees the inside of the window, thereby controlling the DC bias of the plasma near the window to influence less adhesion of nonvolatile byproducts to the surface of the window.

In operation, the setting of the power applied to the powered grid 108, in addition to the set frequency, is selected based on the recipe being performed in the plasma chamber. The recipe, as is well known, will depend on a number of factors and the desired etching operation to be performed. The factors include, without limitation, chamber pressure, chemistries, temperatures, and the power provided by the RF coils, etc. To provide one additional control, it is also desired to set the specific power provided to the powered grid 108 based on the specific recipe. As more power is applied, the IEDF profile of the energy delivered at the set frequency will also increase in magnitude. Alternatively, less power can be applied to reduce the magnitude of the energy, depending on the desired settings for the recipe. Example power provided to the powered grid 108 ranges from between about 5 W and 1000 W. Some examples operate at ranges between 50 W and 300 W, and ranges between 75 W and 150 W.

In one embodiment, the design of the slots (openings) of the powered grid 108 (i.e., where no metallization is provided over the substrate 207), can be tuned to allow for efficient power deposition from the TCP RF system. In one embodiment, the TCP RF power is set to about 13.56 MHz to strike the plasma. In one embodiment, in designing the opening percentage of all the slots from center to edge, it is preferred that the openings are substantially uniform, so that the inner-outer coils power deposition pattern can be kept as close as possible to the case where no powered grid is provided. In one embodiment, the open area percentage (i.e., areas without metallic material) near and around the center is about greater than 50%, while in the area near and around the outer diameter, the open area percentage is about less than 30%. In this example, the percentage of open area is greater near the center and gradually increases as the radius reaches the outer edge of the powered grid 108. This optimization is made in one embodiment so that the opening percentage determines the amount of magnetic flux that can go through the powered grid 108 and thus the TCP power deposited into plasma.

It is also possible to control in-situ and ex-situ cleaning by adjusting the 2 MHz power applied to the powered grid 108. In one embodiment, in-situ cleaning needs substantially lower power to the grid to keep the dielectric window clean during normal wafer processing. But ex-situ requires more power or higher ion energy to sputter off the metallic material that is already deposited on the inner surface of the dielectric window during wafer processing when in-situ clean function is not turned on. It is also possible to provide independent control of TCP plasma density for processing by about 13.56 MHz power and ion energy for cleaning by 2 MHz. In accordance with one embodiment, the 13.56 MHz power on the TCP coils is much more efficient in plasma generation than the 2 MHz power which is capacitively coupled, while the 2 MHz power is much more efficient to increase the ion energy towards the inner surface of the dielectric window, which acts to keep the window substantially clean.

Figure 8A:
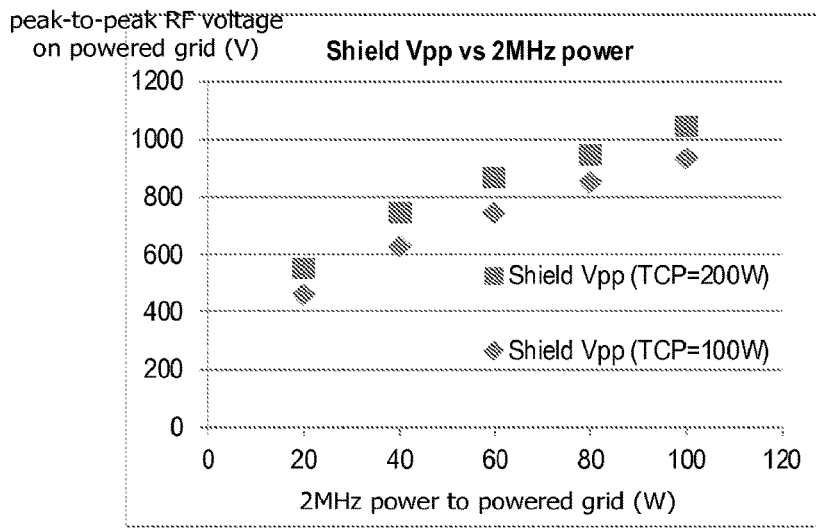
FIG. 8A-11 illustrate how the powered grid does not impact the control of process parameters, while still providing control over reducing or eliminating byproduct accumulation on the inside of the dielectric window, in accordance with one embodiment described in the present disclosure.
Figure 8B:
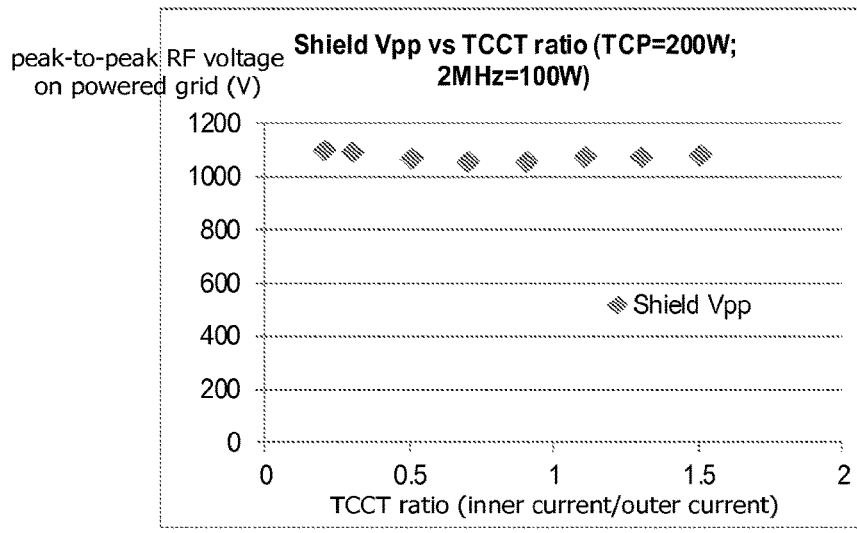
Figure 8C:
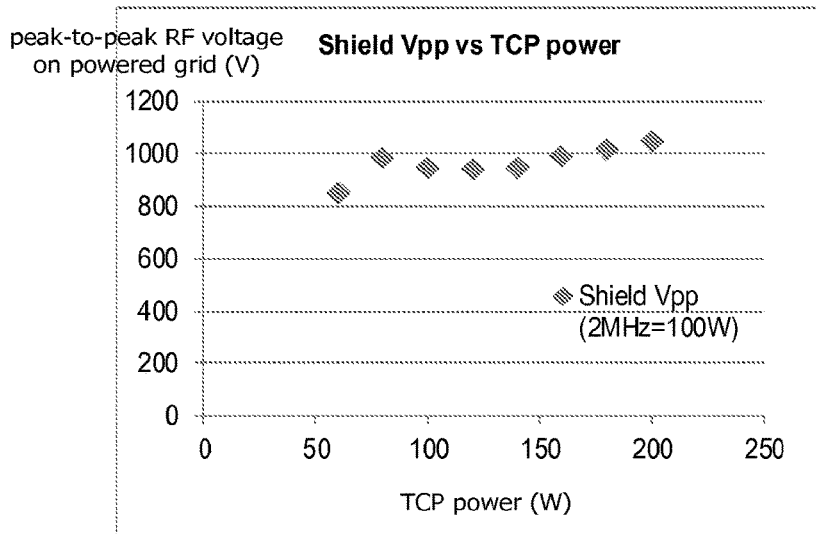

FIGS. 8A-8C illustrate the example control provided to a chamber when the powered grid 108 is installed, in accordance with one embodiment described in the present disclosure. FIG. 8A shows that the RF voltage on the powered grid 108 is independently controlled by its own power. FIG. 8B illustrates that the RF voltage on the powered grid 108 is not significantly affected by the TCCT ratio. FIG. 8C shows that the RF voltage on the powered grid 108 is not significantly affected by PCP power. The test conditions were conducted where argon was run for 200 sccm, chamber pressure was set to about 10 mTorr, and TCCT was set to about 0.8 when not sweeping.

Figure 9A:
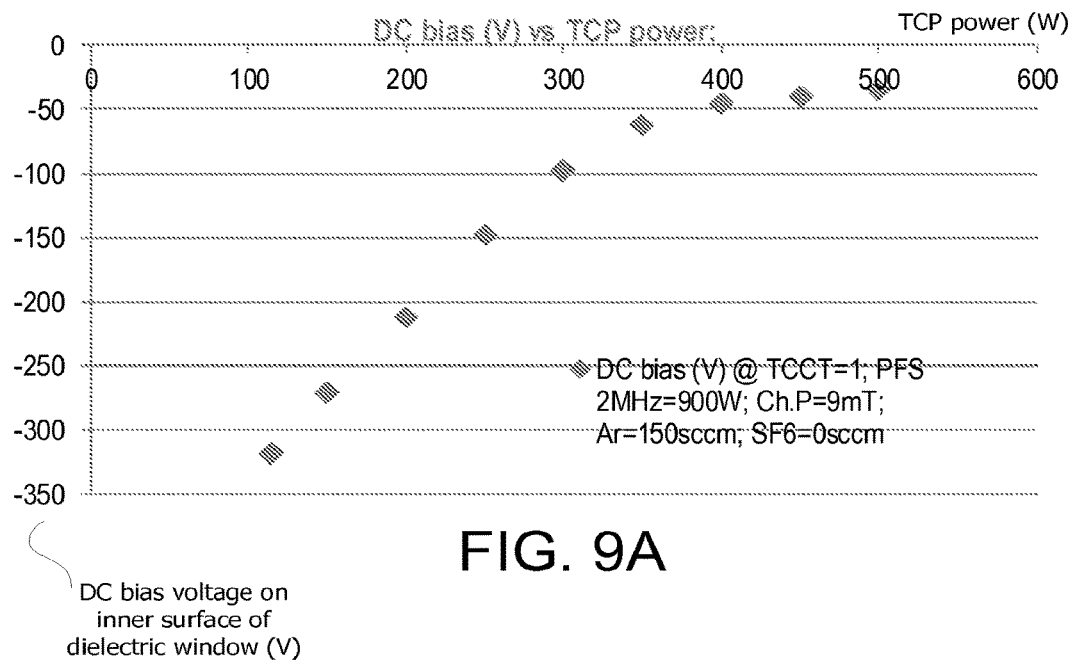
Figure 9B:
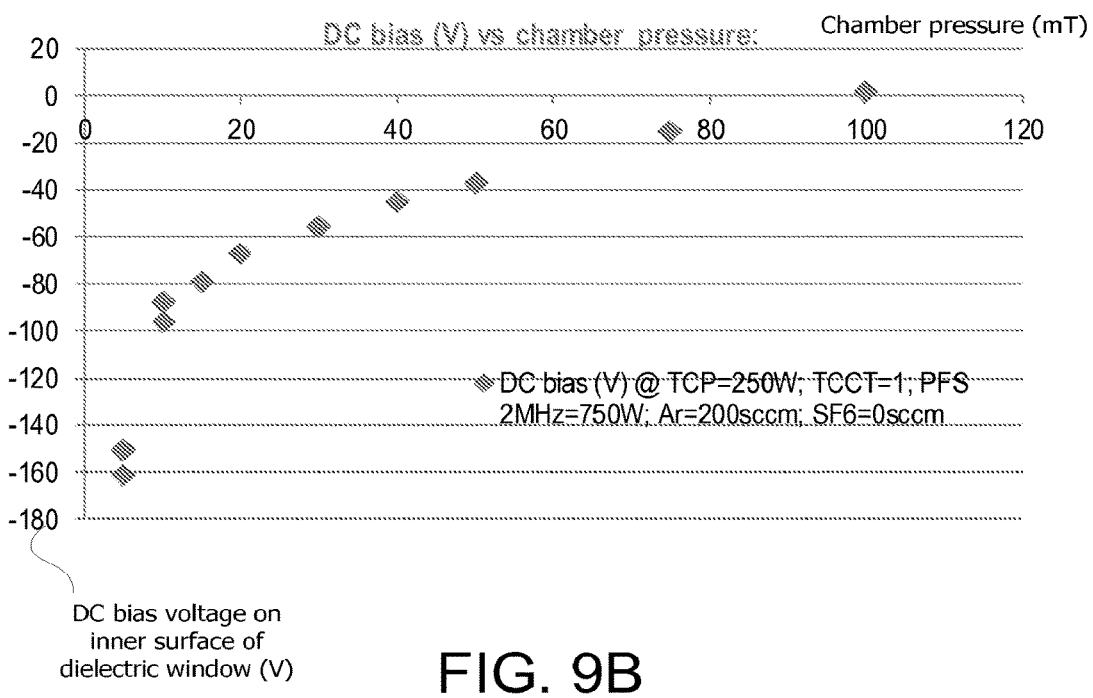

FIG. 9A shows that the DC bias is still controllable versus TCP power when experiment is made using the powered grid 108. This experiment was run with the powered grid 108 set to about 2 MHz and 900 W. FIG. 9B illustrates that the DC bias will also respond to chamber pressure when experiment was run with the powered grid 108. In this experiment, the powered grid was set at 2 MHz and 750 W. By running these experiments of FIGS. 9A and 9B, data is collected to identify optimal settings of power to the powered grid 108, depending on the desired recipe for the process chosen. In practice, many more experiments will be run to qualify a range of power settings for the powered grid 108 to enable users of the system to select an approximate power to apply based on the desired process conditions for the recipe.

Figure 10A:
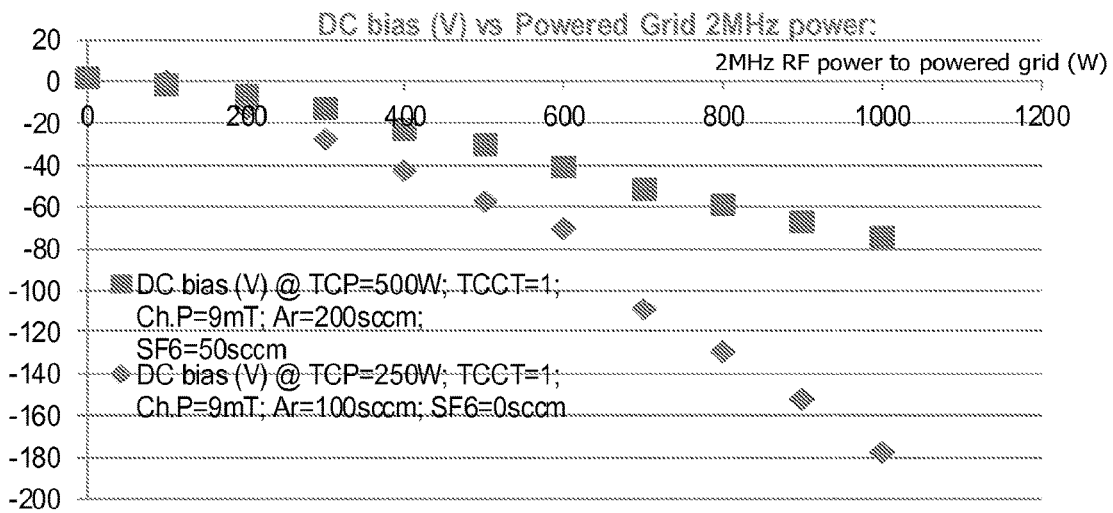
Figure 10B:
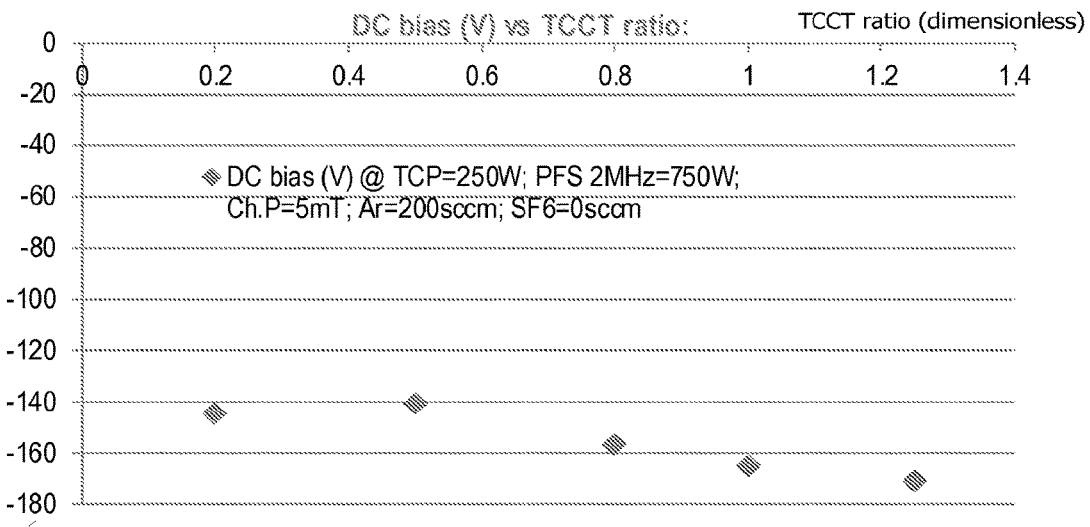
Figure 11:
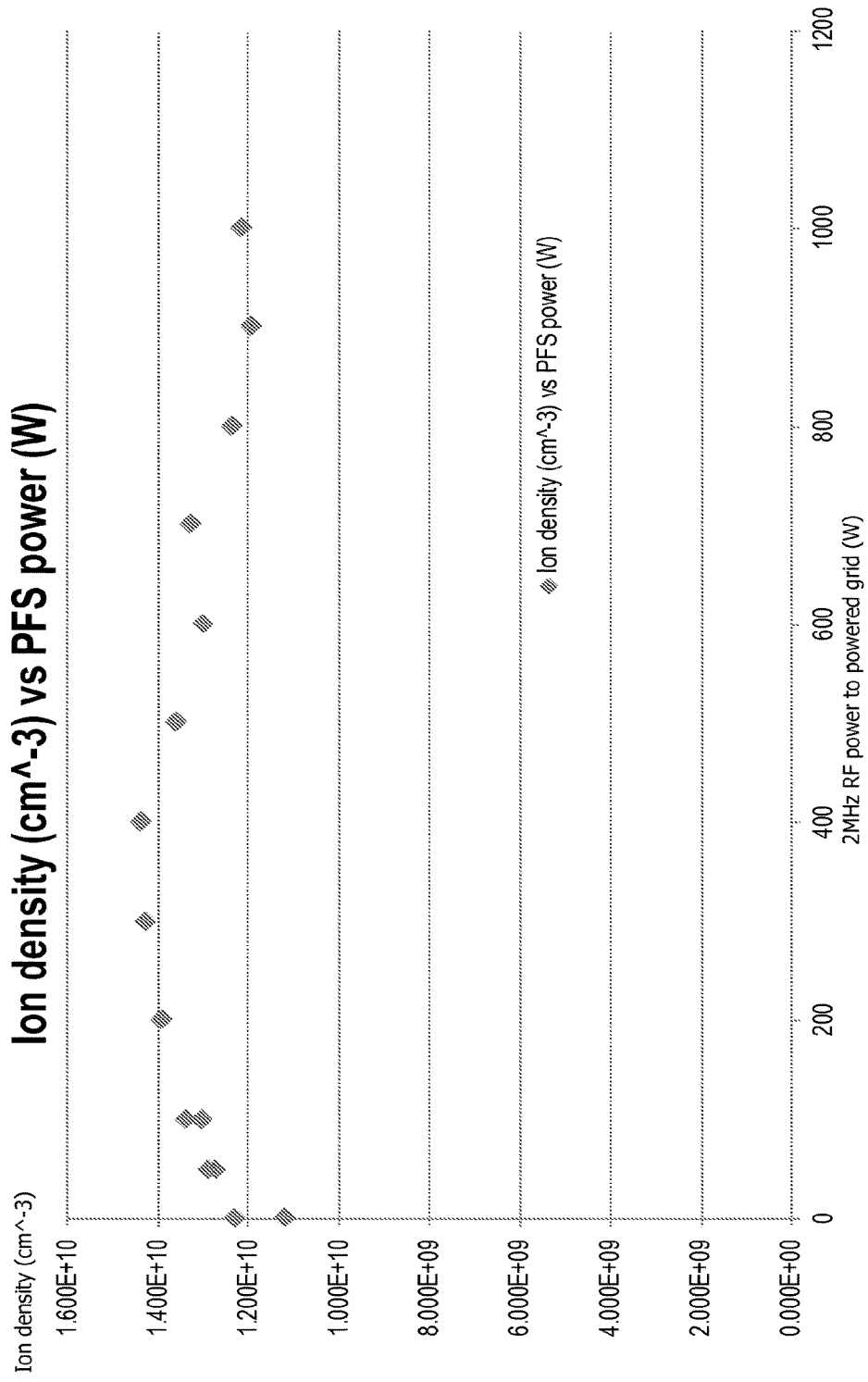

FIGS. 10A and 10B provide data that shows that control over DC bias is still provided when the powered grid 108 is connected to the system. This control is possible because the power to the powered grid 108 is independent to the power of the RF TCP coils. The data illustrated in FIGS. 9A-10B were collected by operating a chamber that included a 100 M-ohm probe with wires being attached to the window. FIG. 11 shows a graph plasma density where the powered grid 108 is implemented. The test conditions for this experiment were for a chamber set at TCP power of 500 W, Argon 200 sccm, SF6 at 50 sccm, and TCCT at 1.

The powered grid 108 described in the above illustrated examples is therefore well suited to prevent or control the deposition of byproducts onto the inside of the dielectric window 106 during plasma etch operations. Having an independent RF power control to the powered grid 108 enables full process and recipe control using standard recipe settings, such as TCP power, pressure, and other variables. As such, installation of the powered grid 108 between the style attribute window at 106 and the TCP coils does not interfere with normal operation or process settings necessary to achieve the performance expected for a particular recipe.

Independent control of the power at a low frequency (i.e., around 2 MHz) will enable the desired settings to assist in reducing deposition of etch byproducts onto the dielectric window 106, and will therefore reduce the number of cleaning operations required for a number of wafers to be processed. Additionally, as noted above, by reducing the deposition of etch byproducts onto the dielectric window 106, it is possible to ensure more consistency during the processing of wafer to wafer and with fewer shutdowns to clean dielectric window. That is, the mean time between chamber cleaning (MTBC) can be significantly increased.

As used herein, independent control of RF power to the powered grid 108 is meant to distinguish this configuration from embodiments that couple metallic structures to the same power provided by the RF coils. The power provided by the RF coils (TCP power) is therefore controlled without regard to the setting of the power provided to the powered grid 108.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A power grid comprising:
a dielectric substrate;
a metal layer overlaid on top of the dielectric substrate, wherein the metal layer has a ring section overlaid on a central region of the dielectric substrate and a plurality of spokes that extend from the ring section to a peripheral edge of the dielectric substrate; and
a metal strap electrically connected to the ring section, wherein the metal strap is configured to extend substantially perpendicular to the dielectric substrate,
wherein the dielectric substrate is configured to be disposed above a dielectric window of a plasma chamber and below an inductive coil, wherein the metal layer is configured to receive radio frequency (RF) power to clean the dielectric window.

2. The power grid of claim 1, wherein the dielectric substrate is a rigid layer that includes a material used to manufacture a printed circuit board, or includes a ceramic material, or includes polytetrafluoroethylene.

3. The power grid of claim 1, wherein the metal layer is between about 0.075 millimeter thick and about 0.5 millimeter thick and the dielectric substrate is between about 0.5 millimeter and 3 millimeter thick.

4. The power grid of claim 1, wherein the metal layer is configured to be coupled to a first RF generator to receive an RF signal having a frequency of about 2 megahertz (MHz) and having the RF power, wherein upon reception of the RF signal, the metal layer is configured to facilitate generation of ion energies within a plasma sheath to further control direct current (DC) bias of plasma near the dielectric window, wherein the DC bias is controlled to decrease adhesion of byproducts of a plasma process to a surface of the dielectric window to clean the dielectric window, wherein the inductive coil is configured to be coupled to a second RF generator to receive an RF signal from the second RF generator.

5. The power grid of claim 1, wherein two adjacent ones of the spokes have a space therebetween, wherein the space is substantially uniform along a length of each of the two adjacent ones of the spokes.

6. The power grid of claim 1, wherein the spokes are connected to the ring section to extend from the ring section, wherein the spokes extend towards an outer diameter of the dielectric window.

7. The power grid of claim 1, wherein the metal strap is configured to connect to an extension strap that is oriented in a substantially horizontal direction to be coupled to an RF generator.

8. The power grid of claim 1, wherein the dielectric substrate is attached to the dielectric window.

9. The power grid of claim 1, wherein the metal layer does not act as a Faraday shield.

10. A power grid comprising:
a dielectric substrate having a disk shape and a central opening;
a metal layer disposed on top of the dielectric substrate, the metal layer having a pattern that includes plurality of extensions that connect to a ring section of the metal layer and extend toward a peripheral region of the dielectric substrate, wherein the ring section of the metal layer surrounds the central opening of the dielectric substrate; and
a metal strap electrically bonded to the ring section of the metal layer, wherein the metal strap extends in a substantial vertical direction with respect to a plane of the dielectric substrate, wherein the dielectric substrate is configured for placement below an inductive coil and above a dielectric window of a plasma chamber, wherein the metal layer is configured to receive radio frequency (RF) power to clean the dielectric window.

11. The power grid of claim 10, wherein the dielectric substrate is a rigid layer that includes a material used to manufacture a printed circuit board, or a ceramic material, or polytetrafluoroethylene.

12. The power grid of claim 10, wherein the metal layer is between about 0.075 millimeter thick and about 0.5 millimeter thick and the dielectric substrate is between about 0.5 millimeter and 3 millimeter thick.

13. The power grid of claim 10, wherein two adjacent ones of the extensions have a space therebetween, wherein the space is substantially uniform along a length of each of the two adjacent ones of the extensions.

14. The power grid of claim 10, wherein the metal layer is configured to be coupled to a first RF generator to receive an RF signal having a frequency of about 2 megahertz (MHz) and having the RF power, wherein upon reception of the RF signal, the metal layer is configured to facilitate generation of ion energies within a plasma sheath to further control direct current (DC) bias of plasma near the dielectric window, wherein the DC bias is controlled to decrease adhesion of byproducts of a plasma process to a surface of the dielectric window to clean the dielectric window, wherein the inductive coil is configured to be coupled to a second RF generator to receive an RF signal from the second RF generator.

15. The power grid of claim 10, wherein the metal strap is configured to connect to an extension strap that is oriented in a substantially horizontal direction to be coupled to an RF generator.

16. The power grid of claim 10, wherein the dielectric substrate is attached to the dielectric window and extends towards an outer diameter of the dielectric window.

17. The power grid of claim 10, wherein the central opening is configured to allow delivery of one or more process gases into the plasma chamber.

18. The power grid of claim 10, wherein the central opening is configured to allow passage of a probing apparatus to enable measurement of a plurality of process parameters.

19. The power grid of claim 10, wherein the metal layer does not act as a Faraday shield.

20. A power grid comprising:
a dielectric substrate;
a metal layer having a ring section that is overlaid on top of a central region of the dielectric substrate;
a plurality of spokes extending in radially outward directions from the ring section of the metal layer, wherein the spokes are tapered in a plurality of radially inward directions towards the ring section of the metal layer and any two adjacent ones of the spokes have a space therebetween; and
a metal strap connected to the ring section of the metal layer and extends in a substantial vertical direction with respect to a plane formed by the spokes, wherein the spokes are arranged below an inductive coil and above a dielectric window of a plasma chamber, wherein the metal layer is configured to receive radio frequency (RF) power to clean the dielectric window.

21. The power grid of claim 20, wherein the dielectric substrate is a rigid layer that includes a material used to manufacture a printed circuit board, or includes a ceramic material, or includes polytetrafluoroethylene.

22. The power grid of claim 20, wherein the metal layer is between about 0.075 millimeter thick and about 0.5 millimeter thick and the dielectric substrate is between about 0.5 millimeter and 3 millimeter thick.

23. The power grid of claim 20, wherein the metal layer is configured to be coupled to a first RF generator to receive an RF signal having a frequency of about 2 megahertz (MHz) and having the RF power, wherein upon reception of the RF signal, the metal layer is configured to facilitate generation of ion energies within a plasma sheath to further control direct current (DC) bias of plasma near the dielectric window, wherein the DC bias is controlled to decrease adhesion of byproducts of a plasma process to a surface of the dielectric window to clean the dielectric window, wherein the inductive coil is configured to be coupled to a second RF generator to receive an RF signal from the second RF generator.

24. The power grid of claim 20, wherein the metal strap is configured to connect to an extension strap that is oriented in a substantially horizontal direction to be coupled to an RF generator.

25. The power grid of claim 20, wherein the dielectric substrate is attached to the dielectric window and extends towards an outer diameter of the dielectric window.

26. The power grid of claim 20, wherein the metal layer does not act as a Faraday shield.

* * * * *